United States Patent
Huang et al.

(10) Patent No.: US 12,119,273 B2
(45) Date of Patent: *Oct. 15, 2024

(54) SYSTEM AND METHOD FOR HIGH SPEED INSPECTION OF SEMICONDUCTOR SUBSTRATES

(71) Applicant: TAIWAN SEMICONDUCTOR MANUFACTURING COMPANY, LTD., Hsinchu (TW)

(72) Inventors: Sheng He Huang, Taichung (TW); Chung-Pin Chou, Hsinchu (TW); Shiue-Ming Guo, Taichung (TW); Hsuan-Chia Kao, Taichung (TW); Yan-Cheng Chen, Taichung (TW); Sheng-Ching Kao, Hsinchu (TW); Jun Xiu Liu, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/223,498

(22) Filed: Jul. 18, 2023

(65) Prior Publication Data

US 2023/0360975 A1 Nov. 9, 2023

Related U.S. Application Data

(63) Continuation of application No. 17/462,916, filed on Aug. 31, 2021, now Pat. No. 11,749,571.

(51) Int. Cl.
*H01L 21/66* (2006.01)
*G01N 21/95* (2006.01)
*G02B 27/14* (2006.01)

(52) U.S. Cl.
CPC ......... *H01L 22/12* (2013.01); *G01N 21/9501* (2013.01); *G01N 2201/063* (2013.01); *G02B 27/144* (2013.01)

(58) Field of Classification Search
CPC ......... G01N 21/9501; G01N 21/95684; G01N 21/8851; G01N 2201/063; G02B 27/14; H01L 22/12
See application file for complete search history.

(56) References Cited

U.S. PATENT DOCUMENTS 8,796,666 B1 8/2014 Huang et al.
9,093,530 B2 7/2015 Huang et al.
(Continued)

FOREIGN PATENT DOCUMENTS

CN 112505064 A 3/2021
KR 20150088206 A 7/2015

OTHER PUBLICATIONS

Notice of Allowance issued in U.S. Appl. No. 17/462,916, dated Apr. 26, 2023.
(Continued)

*Primary Examiner* — Peter B Kim
(74) *Attorney, Agent, or Firm* — STUDEBAKER & BRACKETT PC

(57) ABSTRACT

In a method of inspection of a semiconductor substrate a first beam of light is split into two or more second beams of light. The two or more second beams of light are respectively transmitted onto a first set of two or more first locations on top of the semiconductor substrate. In response to the transmitted two or more second beams of light, two or more reflected beams of light from the first set of two or more first locations are received. The received two or more reflected beams of light are detected to generate two or more detected signals. The two or more detected signals are analyzed to
(Continued)

determine whether a defect exists at the set of the two or more first locations.

20 Claims, 12 Drawing Sheets

(56) References Cited

U.S. PATENT DOCUMENTS

| | | |
|---|---|---|
| 9,134,633 B2 | 9/2015 | Lin et al. |
| 9,230,867 B2 | 1/2016 | Cheng et al. |
| 9,304,403 B2 | 4/2016 | Lin et al. |
| 9,404,743 B2 | 8/2016 | Chiu et al. |
| 9,548,303 B2 | 1/2017 | Lee et al. |
| 9,823,585 B2 | 11/2017 | Shih et al. |
| 9,841,687 B2 | 12/2017 | Lee et al. |
| 9,859,139 B2 | 1/2018 | Cheng et al. |
| 11,749,571 B2 * | 9/2023 | Huang ................ H01L 22/12 356/237.5 |
| 2007/0035725 A1 | 2/2007 | Takahashi et al. |
| 2013/0016346 A1 | 1/2013 | Romanovsky et al. |
| 2017/0307539 A1 * | 10/2017 | Golberg ............. G01N 21/8851 |
| 2021/0305106 A1 | 9/2021 | Jeang et al. |

OTHER PUBLICATIONS

Non-Final Office Action issued in U.S. Appl. No. 17/462,916, dated Dec. 8, 2022.

* cited by examiner

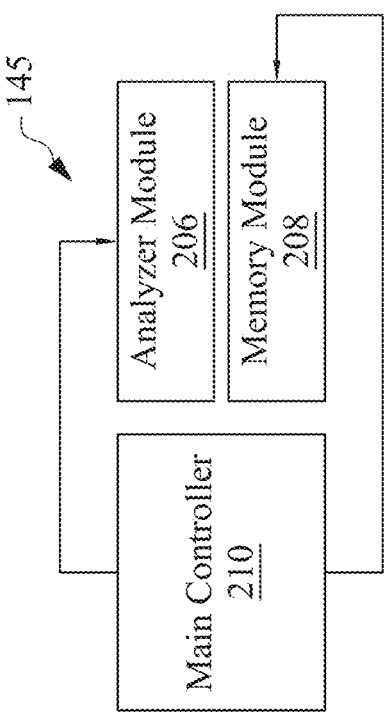
FIG. 2A
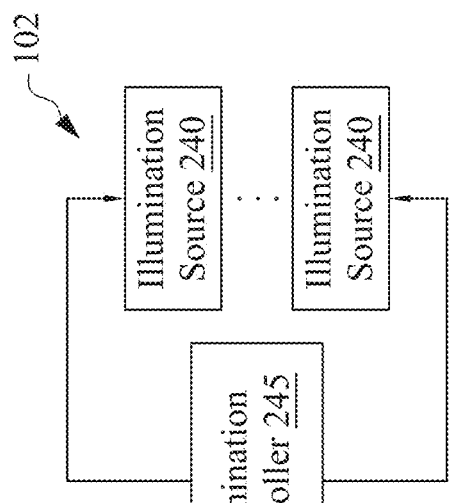
FIG. 2B
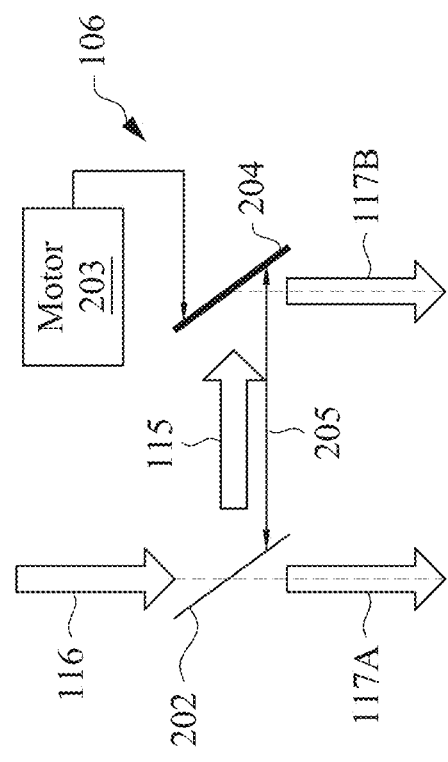
FIG. 2C
FIG. 2D

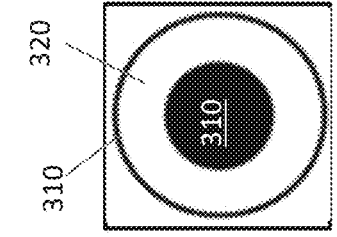
FIG. 3A
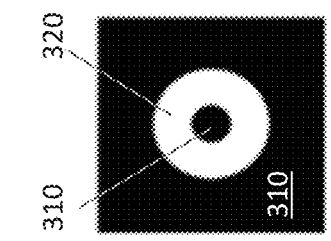
FIG. 3B
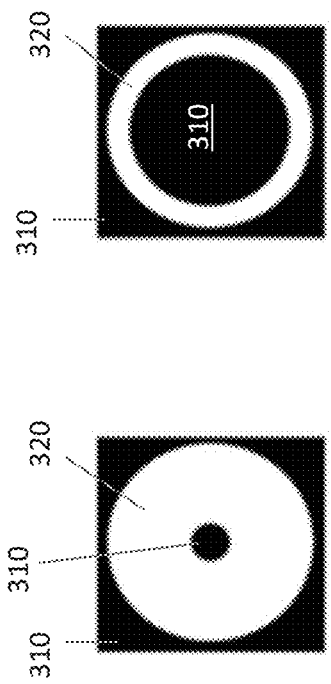
FIG. 3C
FIG. 3D
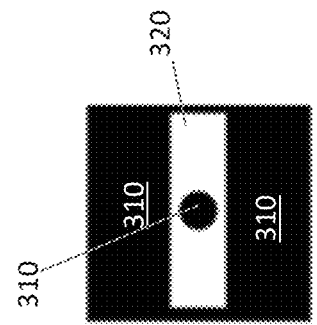
FIG. 3E
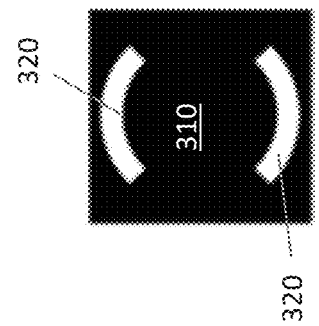
FIG. 3F
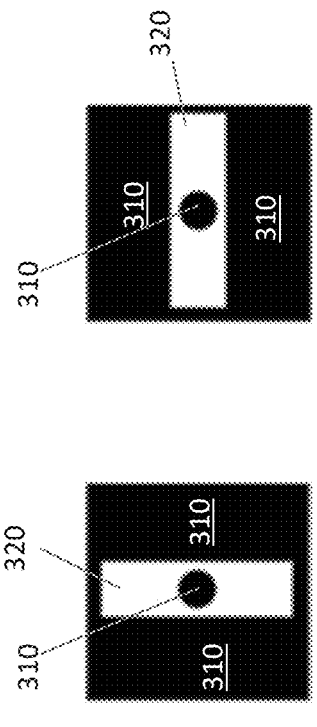
FIG. 3G
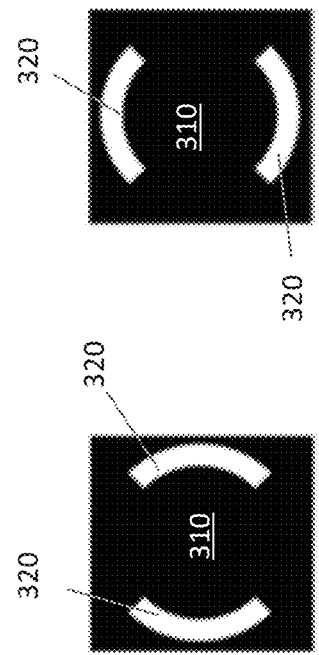
FIG. 3H

SYSTEM AND METHOD FOR HIGH SPEED INSPECTION OF SEMICONDUCTOR SUBSTRATES

PRIORITY CLAIM AND CROSS-REFERENCE

This application is a continuation of U.S. patent application Ser. No. 17/462,916 filed on Aug. 31, 2021, entitled "System And Method For High Speed Inspection Of Semiconductor Substrates," the entire disclosure of which is incorporated herein by reference.

BACKGROUND

The component sizes of the semiconductor devices that are developed on semiconductor substrates, e.g., semiconductor wafers, are reduced. The reduction in component sizes requires higher resolution for inspecting the bare semiconductor substrates and the semiconductor substrates with semiconductor devices developed thereon. During different steps of processing the reduced-size semiconductor devices, the substrates are required to be inspected with high resolution, which cause delay in semiconductor processing. Therefore, it is highly desirable to develop a fast high resolution inspection system.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, and 2D illustrate components of an inspection system for semiconductor substrates in accordance with some embodiments of the present disclosure.

FIGS. 3A, 3B, 3C, 3D, 3E, 3F, 3G, and 3H illustrate spatial filters of an imaging optics of a light detection system of an inspection system in accordance with some embodiments of the present disclosure.

DETAILED DESCRIPTION

Figure 1:
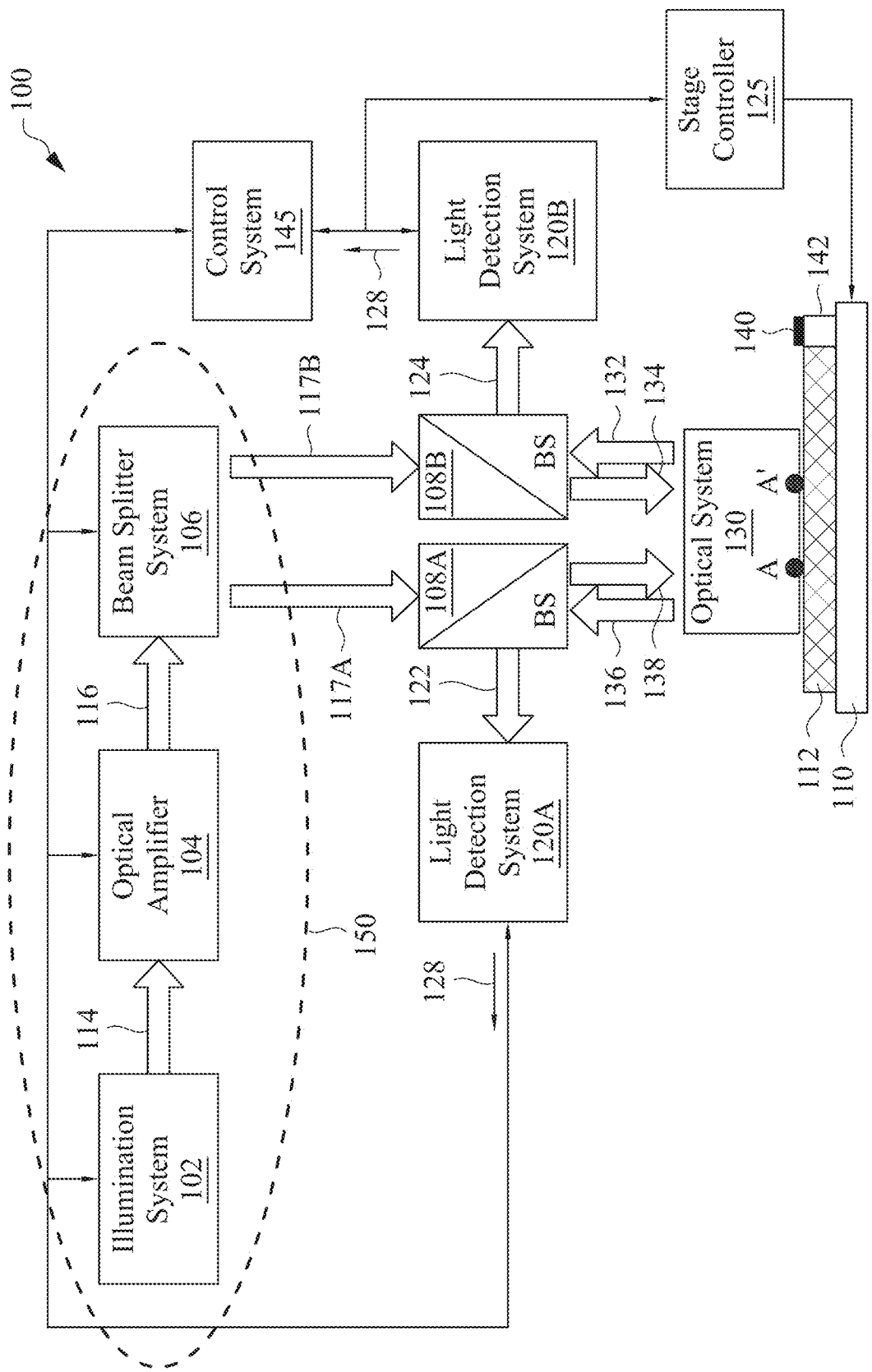
FIG. 1 illustrates an inspection system of semiconductor substrates in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, a substrate, e.g., a wafer, is inspected for defects with an illumination source, e.g., a light source of an inspection system. In some embodiments, the substrate is illuminated position by position, an image of the illuminated position is acquired, and the image of the illuminated position is inspected by an application program (e.g., software) running on a computer processor or a controller. The inspection includes examining the acquired images, determining the defective locations of the acquired images, and reporting defects. Because the component size is reduced in semiconductor devices, a high resolution is required for the inspection that in turn requires a long time for inspection. In some embodiments, a method to reduce the inspection time is to simultaneously illuminate multiple positions, e.g., multiple positions along a line or multiple positions in an area, and simultaneously acquire the images of the multiple positions. In some embodiments, two positions are illuminated at the same time, the two images of the two positions are acquired at the same time, the defective locations of the acquired two images are determined and, then, the inspection system moves to the next two positions and repeats the above steps. Thus, the inspection time is reduced to about one half of the time when the substrate is illuminated position by position.

In some embodiments, the light beam generated from the illumination source of the inspection system is divided into two, four, or eight light beams by a beam splitter system and, thus, two, four, or eight positions are simultaneously illuminated and the inspection time is reduced to about one half, one fourth, or one eighth of the time when the substrate is illuminated position by position. In some embodiments, the two, four, or eight light beams are generated from dividing one or more illumination sources.

In some embodiments, a laser beam from the illumination source of the inspection system is focused position by position on a first layer disposed on the substrate, reflected beams from the positions are detected by an illumination detector, and thicknesses of the first layer at the position are determined. The thicknesses of the positions are compared with a thickness threshold level to determine if one or more defects exist at the positions that are not within the thickness threshold.

FIG. 1 illustrates an inspection system 100 of semiconductor substrates in accordance with some embodiments of the present disclosure. The inspection system 100 includes an illumination optics 150. The illumination optics 150 includes an illumination system 102, an optical amplifier 104, and a beam splitter system 106. In some embodiments, the illumination optics 150 includes the illumination system 102 and the beam splitter system 106, which are respectively described with respect to FIGS. 2D and 2A, and does not include the optical amplifier 104. In some embodiments, the illumination system 102 generates one or more beams of light 114, e.g., radiation beams. Generating multiple beams of light by the illumination system 102 is described in FIG. 5B. In some embodiments, as shown in FIG. 1, the beam of light 114 is amplified, e.g., an amplitude or an intensity of the beam of light 114 is increased, by the optical amplifier 104 and the beam of light 116, e.g., the amplified beam of light, is generated. The beam of light 116 is sent to the beam splitter system 106 where the beam of light 116 is split, e.g., divided, into two or four beams of light. In some embodiments, as shown in FIG. 1, the beam of light 116 is split into two beams of light 117A and 117B that are parallel to each other and have essentially the same intensity. As described, in some embodiments, the optical amplifier 104 is not used and the beams of light 114 are directly transmitted to the beam splitter system 106 to generate the beams of light 117A and 117B.

As shown in the inspection system 100, the beams of light 117A and 117B go through beam splitters 108A and 108B and a portion, e.g., about 50 percent, of the beams of light 117A and 117B pass through the beam splitters 108A and 108B and respectively generate beams of light 138 and 134 that are parallel to the beams of light 117A and 117B. The rest of the beams of light 117A and 117B gets deflected perpendicular to the beams of light 117A and 117B (not shown) and are either absorbed in the beam splitters 108A and 108B or are reflected to outside of inspection system 100. The beams of light 138 and 134 pass through an optical system 130 before impinging on a substrate 112. In some embodiments, the optical system 130 collimates the beams of light 138 and 134 to illuminate two locations A and A', e.g., two positions, on the surface of the substrate 112 with collimated beams. Reflected beams of light 136 and 132 from the two locations A and A' go through the optical system 130 and the beam splitters 108A and 108B, and a portion, e.g., about 50 percent, of the beams of light 136 and 132 generate beams of light 122 and 124 that are perpendicular to the beams of light 136 and 132. The rest of the beams of light 136 and 132 pass through the beam splitters 108A and 108B beams (not shown) and are either absorbed or are reflected to outside of inspection system 100. As shown in FIG. 1, the beams of light 122 and 124 are respectively transmitted to light detection systems 120A and 120B to generate images of the two locations A and A'. In some embodiments, the distance between the locations A and A' is between 0.05 microns and 2000 microns, and in other embodiments, the distance is between 0.5 microns and 100 microns. In some embodiments, the distance between the locations A and A' is adjustable according to a die (chip) size formed on the substrate. In some embodiments, the distance between the locations A and A' is the same as a pitch of the dies (chips) formed on the substrate.

In some embodiments, the beams of light 138 and 134 pass through the optical system 130 to focus the beams of light 138 and 134 on focused points at the two locations A and A' of the surface substrate 112. The reflected beams of light 136 and 132 from the focused points at the two locations A and A' go through the optical system 130 and the beam splitters 108A and 108B to generate the beams of light 122 and 124. Thus, the beams of light 122 and 124 are reflected beams of light from the focused points at the two locations A and A' in some embodiments. In some embodiments, the locations A and A' are areas and images of the areas are acquired and then compared, with respect to size and shape of different portions, with a template image to determine the defects. In some embodiments, artificial intelligence is used to determine the defects. In some embodiments, the images of areas are inspected for narrowing, bridging, or critical dimension of the structures of the image to determine if a defect exists in the locations A and A'. In some other embodiments, the beams of light are focused on one or more points in the locations A and A' and, based on the reflected laser light, a film thickness of a deposited layer in the locations A and A' is determined and the film thickness is compared with a threshold thickness to determine if a defect exists in the locations A and A'.

In some embodiments, as shown in FIG. 1, the substrate 112, e.g., a semiconductor wafer, is mounted on a stage 110 and the stage 110 is coupled and controlled by a stage controller 125. In some embodiments, the stage controller 125 moves the stage 110 such that the beams of light 138 and 134 are directed at two other locations different from the two locations A and A'.

In some embodiments, a fixture 142 is mounted on the stage 110 and a reference chip 140 is mounted on the fixture 142. In some embodiments, the stage controller 125 moves the stage 110 such that the beams of light 138 and 134 are directed at two locations on the reference chip 140. In some embodiments, the reflected beams of light 136 and 132 from the reference chip 140 go through the optical system 130 and the beam splitters 108A and 108B to light detection systems 120A and 120B to be detected by the illumination detectors of the light detection systems 120A and 120B. In some embodiments, detected signals 128 of the light detection systems 120A and 120B based on the reflected beams of light 136 and 132 from the reference chip 140 is used to calibrate the light detection systems 120A and 120B, e.g., to calibrate illumination detectors of the light detection systems 120A and 120B. The inspection system 100 additionally include a control system 145 that is coupled to and controls the stage controller 125, the light detection systems 120A and 120B, the illumination system 102, and the optical amplifier 104. In some embodiments, the control system 145 turns the optical amplifier 104 on to amplify the beam of light 114 to generate an amplified beam of light 116 at the output of the optical amplifier 104. In some embodiments, the control system 145 turns the optical amplifier off to stop amplifying the beam of light 114 and to provide the beam of light 114 at the output of the optical amplifier 104. In some embodiments, the control system 145 is coupled to the beam splitter system 106 and controls, e.g., adjusts, a distance between the beams of light 117A and 117B.

FIGS. 2A, 2B, 2C, and 2D illustrate components of an inspection system for semiconductor substrates in accordance with some embodiments of the present disclosure. FIG. 2A shows the beam splitter system 106 having a beam splitter 202, e.g., a 50 percent beam splitter, and a mirror 204, e.g., a 45 degree mirror, mounted on a fixture (not shown). As shown, the beam of light 116 enters the beam splitter system 106, a first portion, e.g., 50 percent, of the beam of light 116 passes through the beam splitter 202 and generates the beam of light 117A that is in the same direction as the beam of light 116. A remaining second portion of the beam of light 116 get reflected by the beam splitter 202 and generates a beam of light 115 that is perpendicular to the beam of light 116. The beam of light 115 is reflected by the mirror 204 and generates the beam of light 117B that is parallel to the beam of light 116. Thus, the beam splitter system 106 divides the beam of light 116 and generates the two beams of light 117A and 117B that have essentially the same intensity. Also, as shown in FIG. 2A a motor 203 is coupled to the mirror 204, e.g., coupled to the fixture of the mirror 204, and adjusts a distance 205 between the mirror 204 and the beam splitter 202 to adjust a distance between the two beams of light 117A and 117B. In some embodiments, the control system 145 is coupled to the motor 203 of the beam splitter system 106 and controls, e.g., adjusts, the distance 205 that is the distance between the beams of light 117A and 117B. In some embodiments, the distance 205 is adjusted to be the same as a pitch of the dies formed on the substrate such that two neighboring dies are simultaneously scanned.

FIG. 2B shows the control system 145 that includes a main controller 210, an analyzer module 206, and a memory module 208. In some embodiments, the main controller 210 of the control system 145 is coupled to and controls the stage controller 125, the light detection systems 120A and 120B, the illumination system 102, and the optical amplifier 104. In some embodiments, the light detection systems 120A and 120B are coupled to the analyzer module 206 of the control system 145 and the analyzer module 206 receives the detected signals 128 by the light detection systems 120A and 120B. In some embodiments, as described above, the analyzer module 206 receives the detected signals 128 of the reflected beams of light 136 and 132 from the reference chip 140, e.g., reference signals, and saves the reference signals in the memory module 208 of the control system 145. In some embodiments, the analyzer module 206 retrieves the reference signals from the memory module 208 to normalize, e.g., calibrate, the detected signals 128 of the reflected beams of light 136 and 132 from a location, e.g., location A or A', on the substrate 112. In some embodiments, the beams of light 117A and 117B do not have the same intensity. Thus, the signals corresponding to the reflected beams of light 136 and 132 from the locations A and A' on the substrate 112 is normalized by the reference signals corresponding to reflected beams of light 136 and 132.

FIG. 2C shows a detection system, e.g., the light detection systems 120A or 120B. Each one of the light detection systems 120A and 120B has an imaging optics 220 that includes an optical filter, e.g., a spatial optical filter. Each one of the light detection systems 120A and 120B also includes an illumination detector 230. The light detection systems 120A or 120B receives the beam of light 122 or 124 that are transmitted to imaging optics 220. The imaging optics 220 focuses the beam of light 122 or 124 to the illumination detector 230. In some embodiments, the imaging optics 220 applies a spatial filtering on the beam of light 122 or 124 to generate a beam of light 222 or 224 and focusing the beam of light 222 or 224 on the illumination detector 230. In some embodiments, the beam of light 122 or 124 is associated with an image, e.g., an image of the surface of the substrate 112 at the location A or A'. The imaging optics 220 may apply high pass filtering, low pass filtering, band pass filtering, or a combination thereof on the image of the location A or A' on the surface of the substrate 112 before focusing the image on the illumination detector 230, e.g., a two-dimensional image detector. Thus, the illumination detector 230 detects, e.g., determines, an image of the location A or A' on the surface of the substrate 112. In some embodiments, the beam of light 122 or 124, e.g., a laser beam, is the reflected beam of light from a focused laser beam at the location A or A' on the surface of the substrate 112 and the illumination detector 230 detects, e.g., determines, amplitude or intensity and phase of the reflected beam of light. The illumination detector 230 provides the one or more detected signals 128.

FIG. 2D shows the illumination system 102 that includes one or more illumination sources 240 and an illumination controller 245 that is coupled to and controls the illumination sources 240. In some embodiments, each one of the illumination sources 240 generates a separate beam of light, e.g., the beam of light 114, which is transmitted out of the illumination system 102. In some embodiments, the beam of light 114 is a combination of the beams of light generated by the one or more illumination sources 240 and, thus, the beam of light 114 includes multiple frequency bands corresponding to the multiple illumination sources 240. In some embodiments, the illumination sources 240 are laser sources.

FIGS. 3A, 3B, 3C, 3D, 3E, 3F, 3G, and 3H illustrate spatial filters of an imaging optics of a light detection system of an inspection system in accordance with some embodiments of the present disclosure. In some embodiments, the spatial filters of FIGS. 3A, 3B, 3C, 3D, 3E, 3F, 3G, and 3H are used in the imaging optics 220, e.g., in an exit pupil of the imaging optics 220, to perform high pass filtering, band pass filtering, or a combination of high pass filtering and band pass filtering. The high pass filtering allows high frequencies to pass and blocks the other frequencies and the band pass filtering blocks the low frequencies and high frequencies and allows the frequencies between the low frequencies and high frequencies to pass. In the FIGS. 3A, 3B, 3C, 3D, 3E, 3F, 3G, and 3H, dark areas 310, e.g., the black areas, are where the amplitude of the filter is zero and the frequencies in dark areas 310 are blocked by the filter. The bright areas 320, e.g., the white areas, are where the amplitude of the filter is one and the frequencies in bright areas 320 are not blocked by the filter and pass through the filter. In some embodiments, a spatial phase (not shown) exists in the bright areas 320 that shifts the frequencies that pass through the filters.

The spatial filter of FIG. 3B is used to perform high pass filtering along all directions. The spatial filter of FIGS. 3E, and 3F, are used to perform directional high pass filtering along limited directions.

The spatial filters of FIG. 3C is used to perform band pass filtering and blocks the low frequencies and high frequencies. The spatial filters of FIG. 3D is also used to perform band pass filtering and blocks more low frequencies compared to the spatial filter of FIG. 3C and blocks less high frequencies compared to the spatial filter of FIG. 3C.

The spatial filter of FIG. 3A is used to perform a combination of band pass filtering and high pass filtering along all directions and blocks the low frequencies. The spatial filter of FIGS. 3G and 3H perform a combination of band pass filtering and high pass filtering along limited directions. The spatial filter of FIG. 3G blocks the low frequencies and performs filtering of the images along the Y-direction. The spatial filter of FIG. 3H blocks the low frequencies and performs filtering of the images along the X-direction.

As described, the spatial filtering is performed to the images of the location A or A'. In some embodiments, the high pass filtering includes edge detection such that edge detected image of the location A or A' more clearly displays the defects and the images generated by the illumination detector 230 more clearly display the defects. As described above the analyzer module 206 retrieves the detected images. In some embodiments, the analyzer module 206 receives the edge detected images and detects the defects, with higher confidence, in the edge detected images compared to non-edge detected images. In some embodiments, the beam of light 114 includes multiple frequency bands corresponding to the multiple illumination sources 240 and the imaging optics 220 includes filters to separate the multiple frequency bands and to generate the multiple images of the location A or A' in multiple frequency bands. In some embodiments, the analyzer module 206 receives the multiple images of the location A or A' in multiple frequency bands and detects the defects, with higher confidence, using the multiple images of the location A or A' in multiple frequency bands.

Figure 4B:
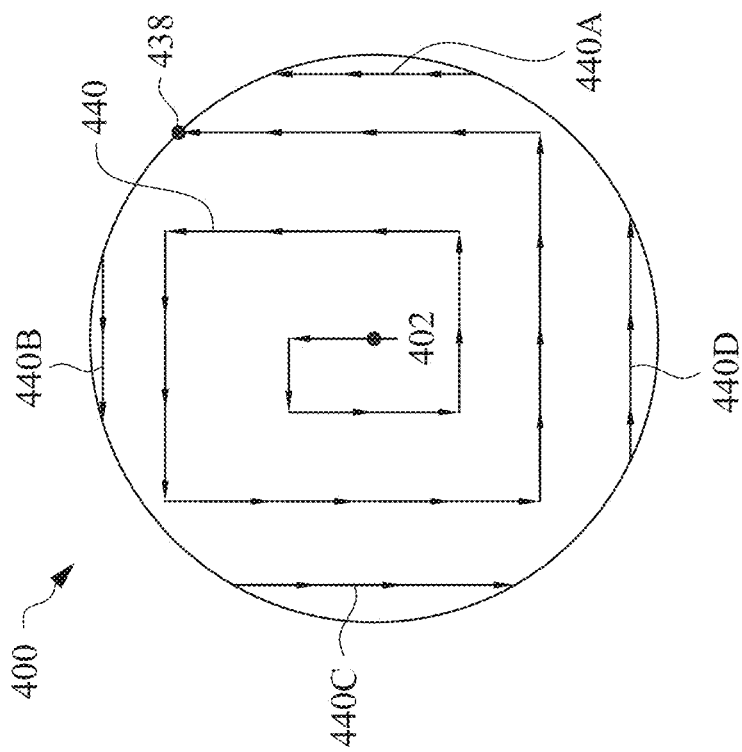
FIGS. 4A, 4B, 4C, 4D, and 4E illustrate scanning patterns for semiconductor substrates in an inspection system in accordance with some embodiments of the present disclosure.
Figure 4A:
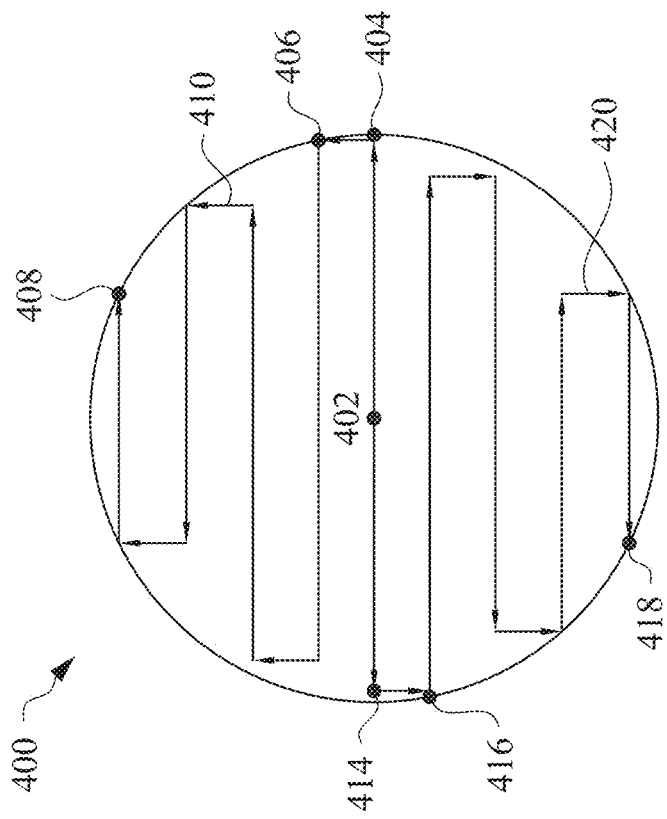

FIGS. 4A, 4B, 4C, 4D, and 4E illustrate scanning patterns for semiconductor substrates in an inspection system in accordance with some embodiments of the present disclosure. FIG. 4A shows a scan pattern for a wafer 400, e.g., a substrate. The scanning pattern includes two scanning paths 410 and 420 that are performed sequentially. In some embodiments, the scanning path 410 starts at a center 402 of the wafer and the scanning of the wafer 400 by the inspection system 100 continues along the path 410 between the center 402 and a point 408 at the vicinity of the edge of the wafer 400. The path 410 includes a horizontal move from the center 402 to a point 404 at the vicinity of the wafer edge, a vertical move from the point 404 to another point 406 at the vicinity of the wafer edge, followed by multiple horizontal and vertical moves between the points at the vicinity of the wafer edge, shown in FIG. 4A, until the path 410 ends at the point 408. In some embodiments, the scanning path 420 starts at the center 402 and the scanning of the wafer 400 by the inspection system 100 continues along the path 420 between the center 402 and a point 418 at the vicinity of the edge of the wafer 400. The path 420 includes a horizontal move from the center 402 to a point 414 at the vicinity of the wafer edge, a vertical move from the point 414 to another point 416 at the vicinity of the wafer edge, followed by multiple horizontal and vertical moves between the points at the vicinity of the wafer edge, shown in FIG. 4A, until the path 420 ends at the point 418.

FIG. 4B shows a scan pattern for the wafer 400. In some embodiments, the scanning pattern includes a spiral scanning path 440 that starts at the center 402 of the wafer and the scanning of the wafer 400 by the inspection system 100 continues along the spiral path 440 between the center 402 and a point 438 at the vicinity of the edge of the wafer 400. The path 440 includes multiple horizontal and vertical moves between the center 402 and the point 438. The scanning pattern also includes broken segments 440A, 440B, 440C, and 440D that are continuation of the spiral path 440 near the edge of the wafer. The scanning of the wafer 400 is complete when the path 440 and the broken segments 440A, 440B, 440C, and 440D are scanned.

Figure 4E:
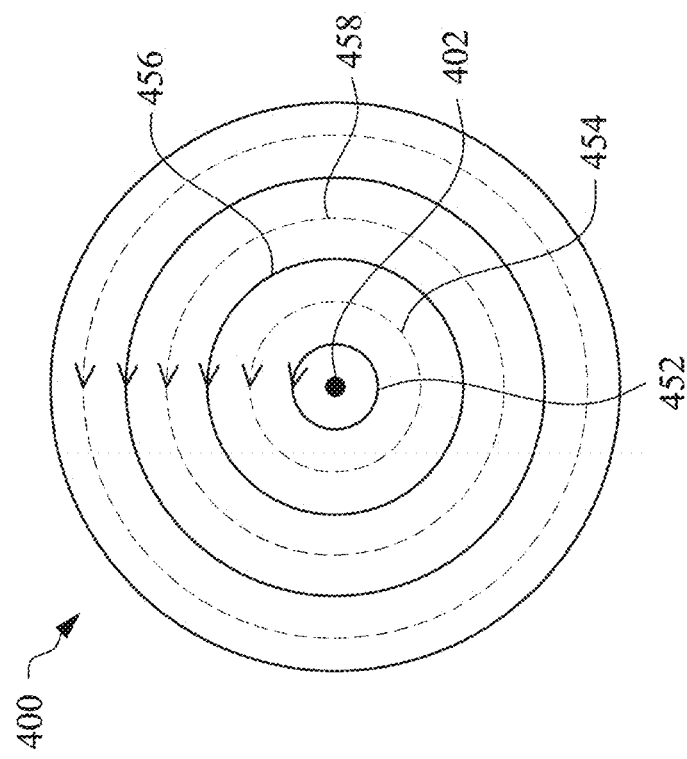
Figure 4C:
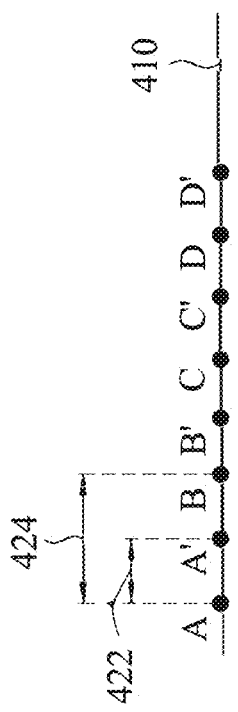

FIG. 4C shows the scanning pattern when using inspection system 100 for scanning the wafer 400. As described with respect to FIG. 1, the inspection system 100 generates two beams of light for simultaneously measure, e.g., sample or inspect, two locations A and A' on the surface of the wafer 400. Thus, inspecting the wafer 400 along the scanning paths 410, 420, and 440 of FIGS. 4A and 4B are performed two locations at a time, which causes a faster scanning of the wafer 400 compared to when only one location is inspected at a time. FIG. 4C shows the sampling locations along the path 410, 420, or 440. As shown the locations A and A' (a first pair of locations), B and B' (a second pair of locations), C and C' (a third pair of locations), and D and D' (a fourth pair of locations), are simultaneously inspected. In some embodiments, the distance 422 is between 0.1 microns and 1000 microns and the distance 424 is between 0.2 microns and 2000 microns. In some embodiments, the distances 422 and 424 depend on the chip size, e.g., a pitch of the dies of the chip. Thus, the stage stops and inspects two dies at the same time and moves two dies and inspects the next two dies. In some embodiments, the stage stops and the inspection system 100 acquires the images of the location A and A' and after acquiring the images by the light detection systems 120A and 120B the stage moves to next two locations. In some embodiments, the analyzer module 206 that receives the images (e.g., the detected signals 128 that includes the images,) analyzes the images during the movement of the stage to the next two location and afterwards to detect the defects.

Figure 4D:
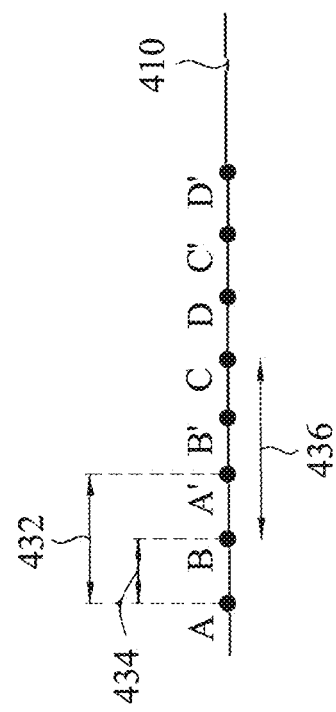

FIG. 4D shows the scanning pattern when using inspection system 100 for scanning the wafer 400. FIG. 4D is consistent with FIG. 4C with the difference that a distance 432 that exists between the pair of locations that are simultaneously inspected is larger than a distance 434 that the stage moves after inspecting the first pair of locations A and A' to inspect the second pair of locations B and B'. Thus, one of the locations of the second pair of locations occurs between the locations of the first pair of locations. As shown, the stage 110 move a distance 436 for the third pair of locations C and C'. In some embodiments, the distance 432 is between 0.2 microns and 2000 microns, the distance 434 is between 0.1 microns and 1000 microns, and the distance 436 is between 0.3 microns and 3000 microns.

FIG. 4E shows the scanning pattern when using inspection system 100 for scanning the wafer 400. In FIG. 4E, a chuck of the stage 110 rotates the wafer 400 around the center 402 and, thus, the scanning patterns have a circular shape around the center 402 of the wafer 400. Because the inspection system 100 inspect two (or more) locations at the same time, in FIG. 4E, the circles 452 and 454 are simultaneously sampled such that the location A stays on circle 454 and the location A' stays on the circle 452. Because the perimeter of the circles 452 and 454 are not equal, the density of the inspection are not the same along the circles 452 and 454. After inspecting the circles 452 and 454, the stage controller moves the stage the distance between the circles 452 and 454 and then inspects along the circles 456 and 458. Again, because two locations are inspected at the same time, the scanning of the wafer 400 is faster compared to when only one locations is inspected at a time. Accordingly, the stage is moved and another two concentric circles are inspected until the entire wafer 400 is inspected. In some embodiments, a distance between each two neighboring concentric circles of FIG. 4E is between 0.1 microns and 1000 microns.

Figure 5A:
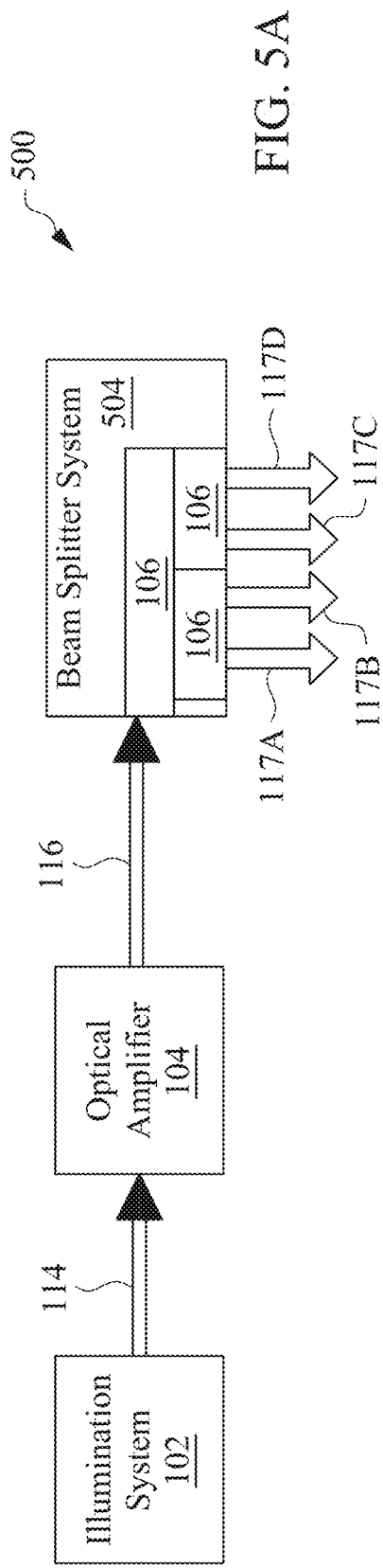
FIGS. 5A, 5B, 5C, and 5D illustrate illumination optics of an inspection system in accordance with some embodiments of the present disclosure.

FIGS. 5A, 5B, 5C, and 5D illustrate illumination optics of an inspection system in accordance with some embodiments of the present disclosure. FIG. 5A shows illumination optics 500 which is consistent with the illumination optics 150 of FIG. 1 with the difference that a beam splitter system 504 of FIG. 5A divides the beam of light 116 into four beams of light 117A, 117B, 117C, and 117D. In some embodiments, the beams of light 117A, 117B, 117C, and 117D are parallel with essentially the same intensity. As shown, the beam splitter system 504 implements three beam splitter systems 106 in two consecutive stages. In the first stage, one beam splitter system 106 divides the beam of light 116 into two halved beams. In the second stage, following the first stage, two beam splitter systems 106 are used such that each one of the two beam splitter systems 106 divides each halved beam into two beams and, thus, generates the four beams of light 117A, 117B, 117C, and 117D. When using the beam splitter system 504 in inspection system 100 of FIG. 1, with also using four beam splitters and four light detection systems, the inspection system 100 inspects four locations simultaneously and, thus, reduces the scan time. In some embodiments, the stage 110 stops, the four locations on the substrate 112 are inspected, and the stage 110 moves to the next four locations. In some embodiments, as described, the distance between the every two neighboring beams of light 117A, 117B, 117C, and 117D is a horizontal pitch of the dies of the chip. Thus, the stage stops, inspects four locations in four consecutive dies in horizontal direction, and moves to the next four dies in horizontal direction. In some embodiments, when the locations reach the wafer edge, the stage moves the wafer one vertical pitch up or down and continues with inspecting another row. Thus, the inspection time is reduced by about four times.

Figure 5B:
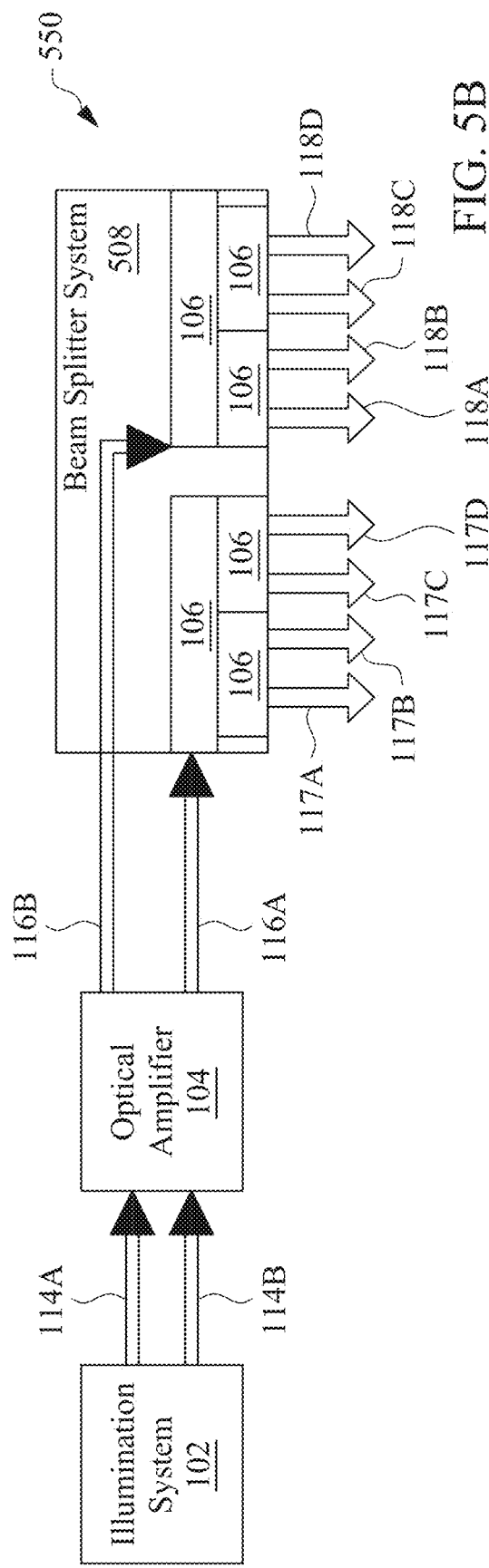

FIG. 5B shows illumination optics 550 which is consistent with the illumination optics 500 of FIG. 5A with the difference that a beam splitter system 508 of FIG. 5B divides two separate beams of light 116A and 116B into eight beams of light. The illumination system 102 generates two separate beams of light 114A and 114B that are amplified by the optical amplifier 104 and the amplified beams of light 116A and 116B are generated. The beam splitter system 508, includes two sets of the three beam splitter systems 106 in two consecutive stages of FIG. 5A. One set of the three beam splitter systems 106 in two consecutive stages divides the beam of light 116A into four beams of light 117A, 117B, 117C, and 117D. The other set of the three beam splitter systems 106 in two consecutive stages divides the beam of light 116B into four beams of light 118A, 118B, 118C, and 118D. When using the beam splitter system 508 in inspection system 100 of FIG. 1, with using eight beam splitters and eight light detection systems, the inspection system 100 inspects eight locations simultaneously and, thus, further reduces the scan time. In some embodiments, the stage 110 stops, the eight locations on the substrate 112 are inspected, and the stage 110 moves to the next eight locations. In some embodiments, as described, the distance between the every two neighboring beams of light 117A, 117B, 117C, and 117D or 118A, 118B, 118C, and 118D is a horizontal pitch of the dies of the chip. Thus, the stage stops, inspects eight locations in eight consecutive dies in horizontal direction, and moves to the next eight dies in horizontal direction. In some embodiments, when the locations reach the wafer edge, the stage moves the wafer one vertical pitch up or down and continues with inspecting another row. Thus, the inspection time is reduced by about eight times.

Figure 5C:
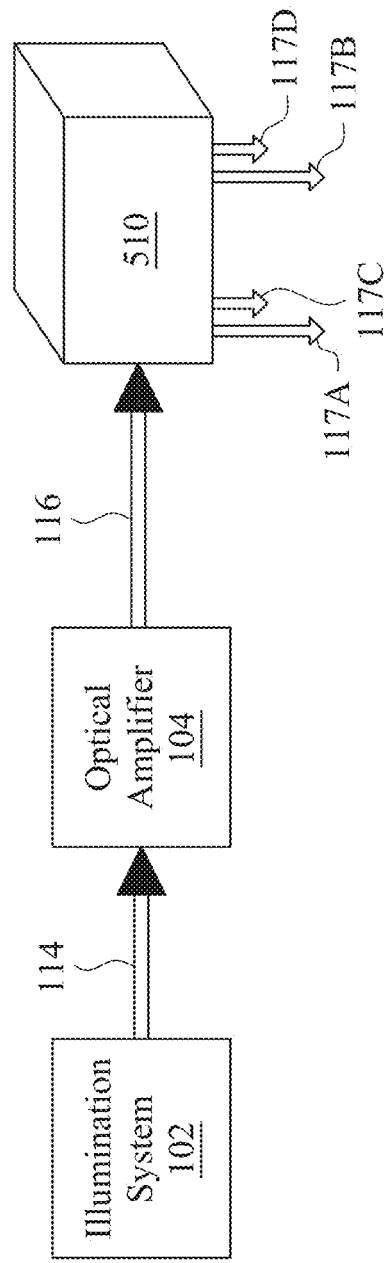

FIG. 5C is consistent with FIG. 5A with the difference that beam splitter system 510 of FIG. 5C produces the four beams of light 117A, 117B, 117C, and 117D in a two-dimensional configuration of two by two beams of light. In some embodiments, a distance between the beams of light 117A and 117B or between the beams of light 117B and 117D is between 0.1 microns and 1000 microns. In some embodiments, a distance between the beams of light between 117A and 117B is a horizontal pitch of the dies and the distance between the beams of light 117B and 117D is a vertical pitch of the dies of the chip. In some embodiments, the stage 110 stops, the two by two locations on the substrate 112 are inspected in four dies (e.g., two by two neighboring dies), and moves to the next two by two dies in horizontal direction or in vertical direction. In some embodiments, the stage 110 moves horizontally and when the locations reach the wafer edge, the stage moves the wafer two vertical pitches up or down and continues with inspecting another row. Thus, the inspection time is reduced by about four times.

Figure 5D:
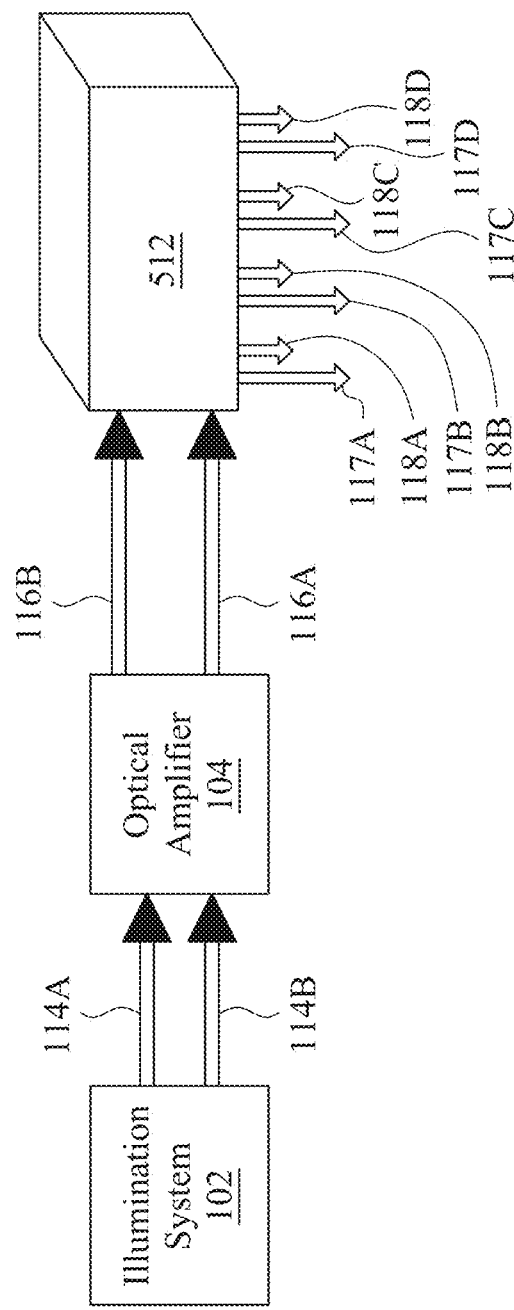

FIG. 5D is consistent with FIG. 5B with the difference that beam splitter system 512 of FIG. 5D produces the four beams of light 117A, 117B, 117C, and 117D and the four beams of light 118A, 118B, 118C, and 118D in a two-dimensional configuration of two by four beams of light. In some embodiments, a distance between each neighboring beams of light 117A, 117B, 117C, and 117D, between each neighboring beams of light 118A, 118B, 118C, and 118D, or between the beams of light 117A and 118A is between 0.1 microns and 1000 microns. In some embodiments, a distance between each neighboring beams of light 117A, 117B, 117C, and 117D, between each neighboring beams of light 118A, 118B, 118C, and 118D, or between the beams of light 117A and 118 A is a pitch of the dies of the chip. In some embodiments, the stage 110 stops, the two by four locations on the substrate 112 are inspected in eight dies (e.g., two by four neighboring dies), and moves to the next two by four dies in horizontal direction by moving four horizontal pitch at a time. In some embodiments, the stage 110 moves horizontally and when the locations reach the wafer edge, the stage moves the wafer two vertical pitches up or down and continues with inspecting another row. Thus, the inspection time is reduced by about eight times.

Figure 6A:
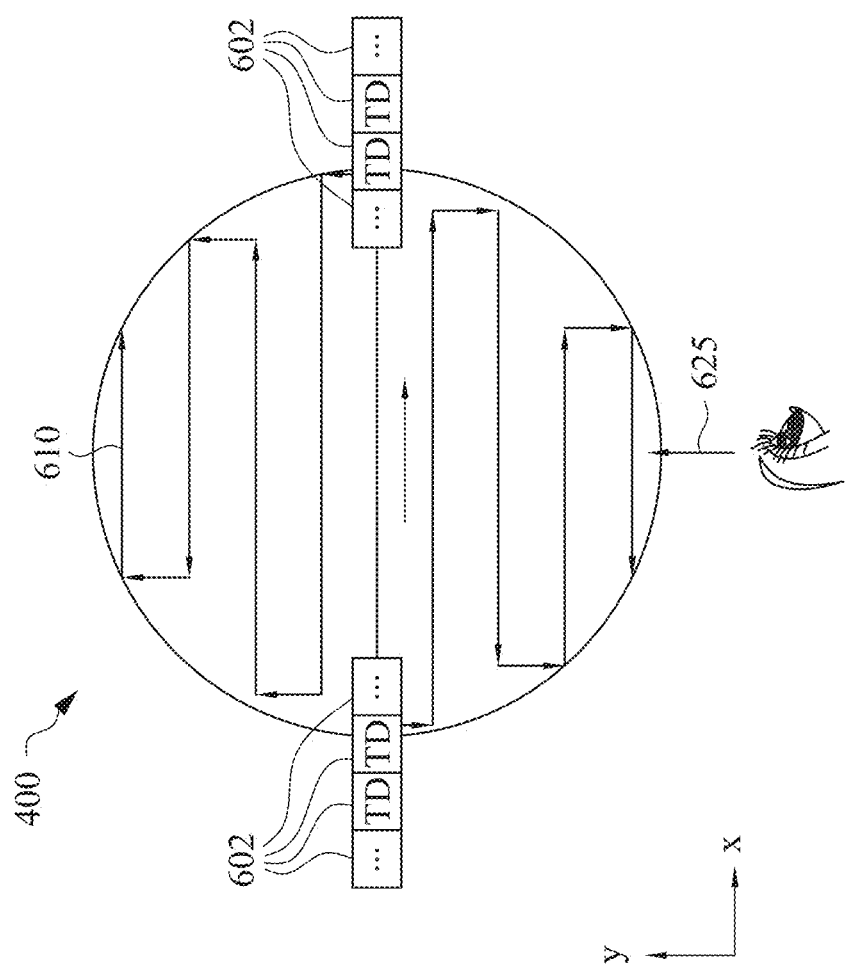
FIGS. 6A, 6B, and 6C illustrate a scanning pattern and a side view of inspection systems performing the scanning.
Figure 6B:
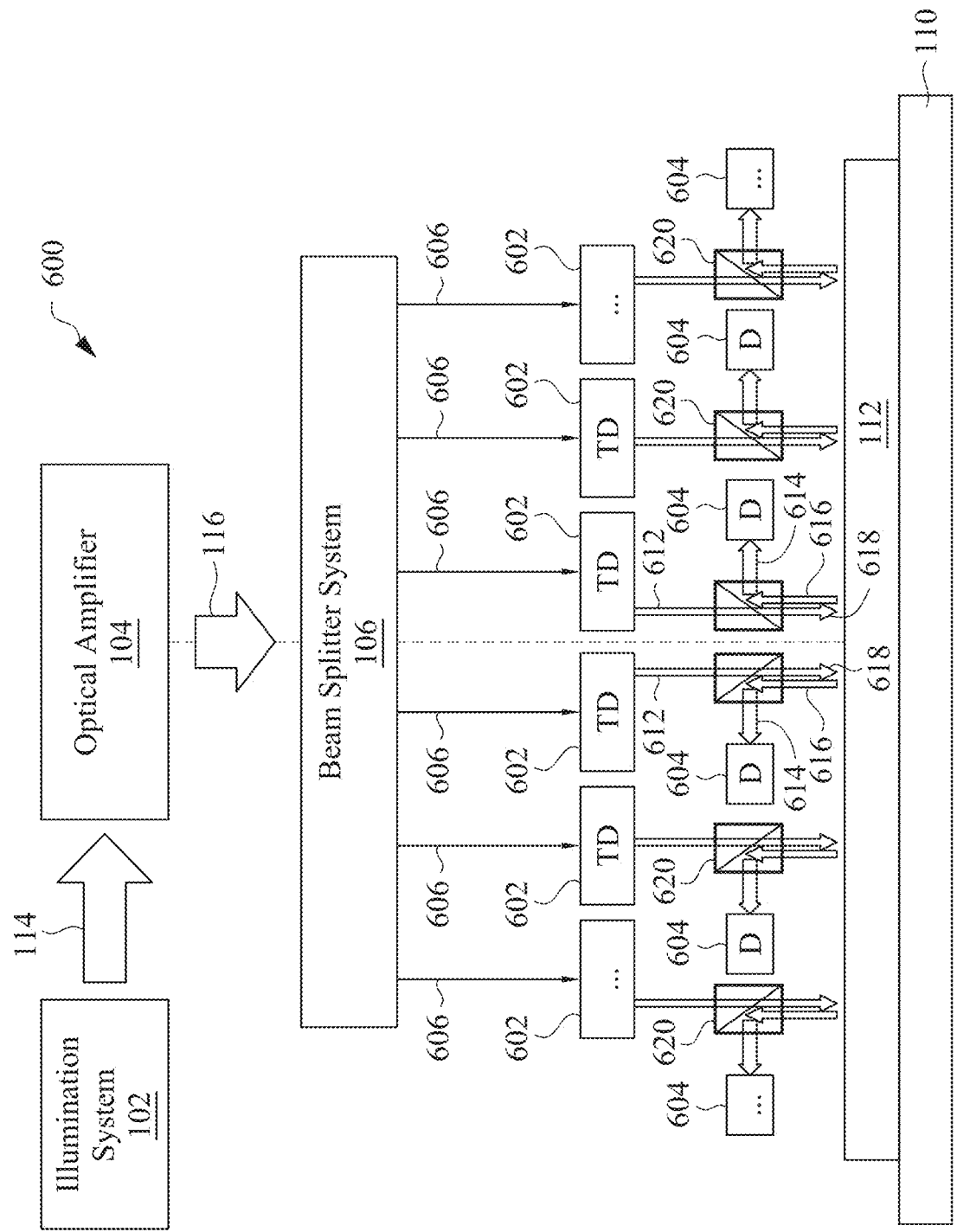
Figure 6C:
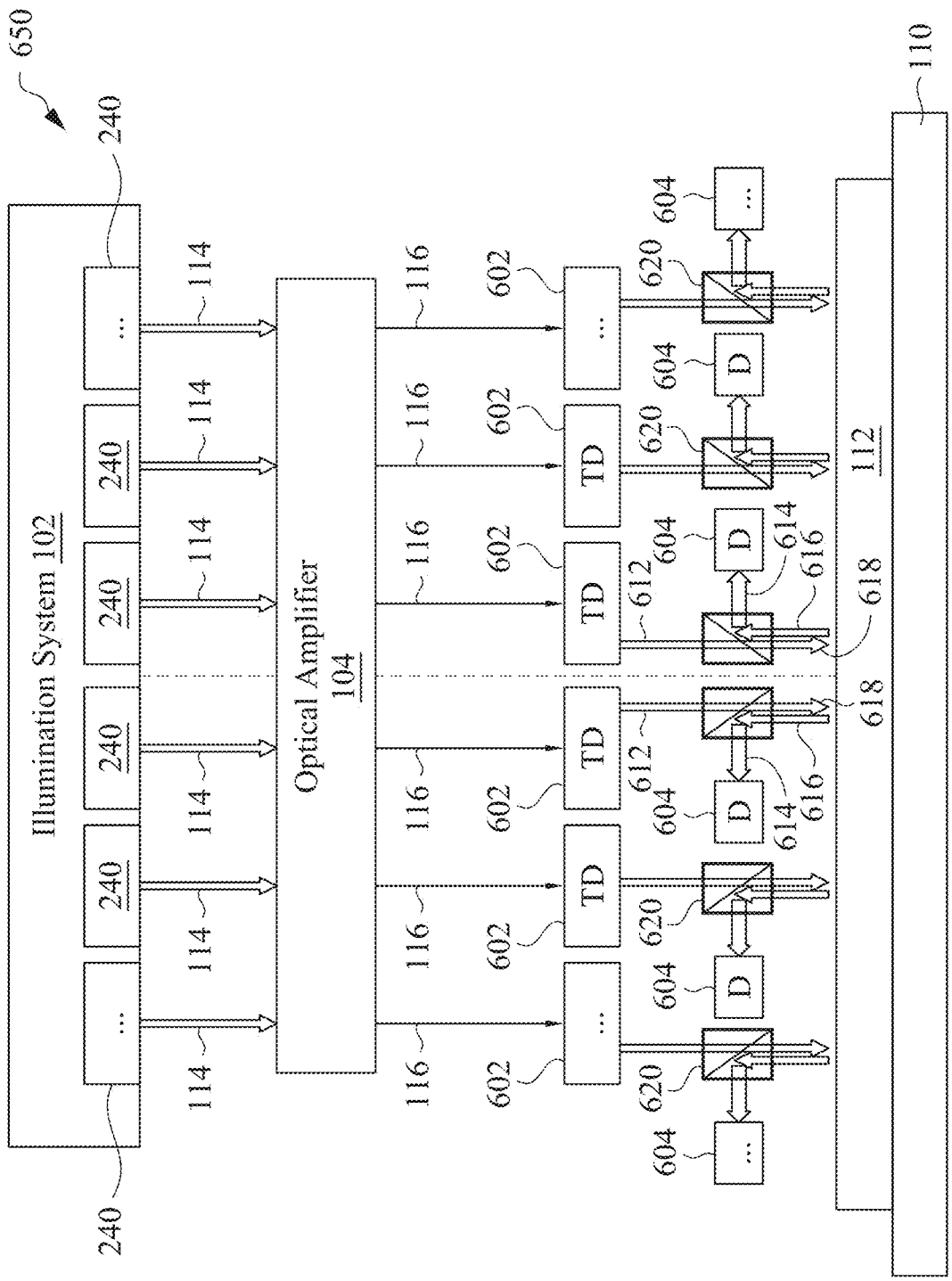

FIGS. 6A, 6B, and 6C illustrate a scanning pattern and a side view of inspection systems performing the scanning. The scanning pattern of FIG. 6A, in x-y plane of wafer 400, is consistent with the scanning pattern of FIG. 4A and the path 610 is consistent with the combination of the paths 410 and 420 of FIG. 4A. The test device 602 (TD) is described with respect to FIG. 6A and shows how the test locations move along the path 610. A direction 625 shows a side view that the inspection system of FIG. 6B is viewed.

The inspection system 600 of FIG. 6B is consistent with the inspection system 100 of FIG. 1. The inspection system 600 includes the illumination system 102 that includes one or more illumination sources 240 that generate the beam of light 114. The optical amplifier 104 of the inspection system 600 amplifies the beam of light 114 and generates the beam of light 116. In some embodiments, the beam of light 114 includes two or more beams of light consistent with the beams of light 114A and 114B of FIG. 5B that are generated from two or more illumination sources 240. Also, the beam of light 116 includes two or more beams of light consistent with the beams of light 116A and 116B of FIG. 5B. As shown in FIG. 6A, the beam splitter system 106 divides the beam of light 116 into a plurality, e.g., four, six, or more, beams of light 606 that are consistent with the beams of light 117A, 117B, 117C, and 117D and the beams of light 118A, 118B, 118C, and 118D. The plurality of beams of light 606 go through the plurality of beam splitters 620 that are consistent with the beam splitters 108A and 108B. Consistent with FIG. 1, the plurality of beams of light 618 that pass through the plurality of beam splitters 620 impinge of the substrate 112 that is mounted on the stage 110. Also, consistent with FIG. 1, the plurality of reflected beams of light 616 go through the plurality of the beam splitters 620 and produce the plurality of beams of light 614 that are detected by the plurality of light detection systems 604 (D). Consistent with FIG. 1, the plurality of light detection systems 604 are coupled to the control system 145 and the analyzer module 206 of the control system 145 receives the detected signal of the light detection systems 604 and determines the defects. In some embodiments, the test devices 602 provide an optical system for spatial filtering, adjusting the aperture (e.g., the exit aperture), or for providing polarization and producing beams of light 612 from the beams of light 606. In some embodiments, the light detection systems 604 uses the polarization of the incident beams of light 618 and reflected beams of light 616 and 614 to determine the film thickness or the refractive index of the layer deposited on the substrate 112.

The inspection system 650 of FIG. 6C is consistent with the inspection system 600 of FIG. 6B with the difference that the illumination system 102 includes a plurality of separate illumination sources 240, e.g., laser sources. In some embodiments, the illumination system 102 includes between two and ten separate illumination sources. The illumination sources 240 produce the plurality of separate beams of light 114 that are amplified by the optical amplifier 104 and produces the plurality of amplified beams of light 616. As shown the inspection system 650 does not includes the beam splitter system 106 and, thus, the plurality of amplified beams of light 616 are consistent with the beams of light 606 of FIG. 6B that enter the test devices 602. As described with respect to FIG. 6B, in some embodiments, the test devices 602 provide the spatial filters of FIGS. 3A, 3B, 3C, 3D, 3E, 3F, 3G, and 3H, adjust the aperture (e.g., the exit aperture), or provide polarization. Thus, the test devices 602 perform the above tasks on the beams of light 606 and produce the beams of light 612 that interact with the substrate 112.

Figure 7:
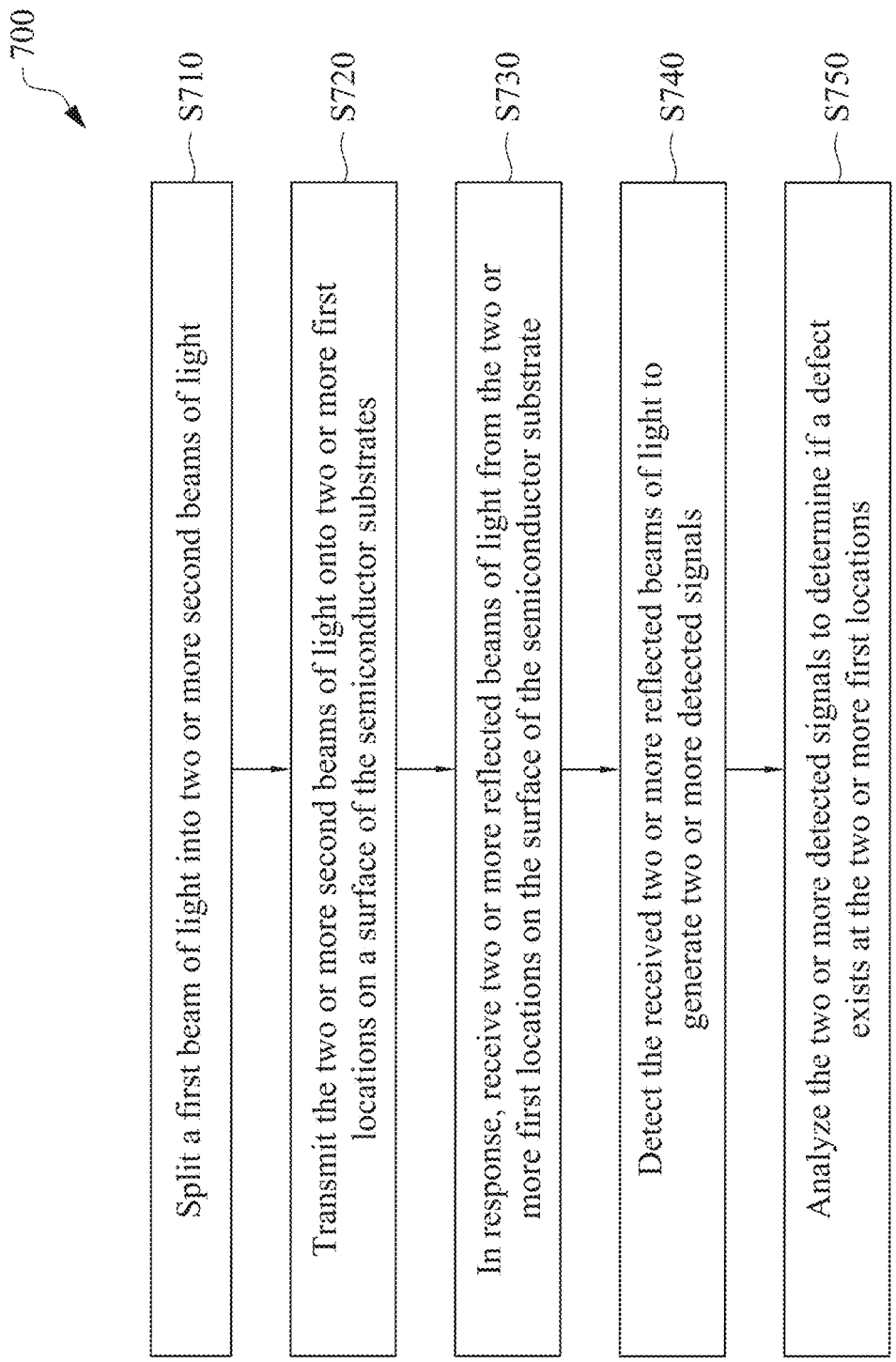
FIG. 7 illustrates a flow diagram of a process for inspection of a semiconductor substrate in accordance with some embodiments of the disclosure.

FIG. 7 illustrates a flow diagram of a process 700 for inspection of a semiconductor substrate in accordance with some embodiments of the disclosure. The process 700 may be performed by the inspection system 100 of FIGS. 1, 2A, 2B, 2C, and 2D. In some embodiments, the process 700 or a portion of the process 700 is performed and/or is controlled by the computer system 800 described below with respect to FIGS. 8A and 8B.

The method includes the operation S710 that a first beam of light is split into two or more second beams of light. As shown in FIG. 1, the beam of light 116 is split by the beam splitter system 106 into second beams of light 117A and 117B. In operation S720, the two or more second beams of light are transmitted onto two or more first locations on a surface of the semiconductor substrates. As shown in FIG. 1, the second beams of light 117A and 117B are transmitted, through the beam splitters 108A and 108B and the optical system 130 onto the surface of the substrate 112.

In operation S730, in response to the transmitted beams of light, two or more reflected beams of light are received from the two or more first locations on the surface of the semiconductor substrate. As shown in FIG. 1, the reflected beams of light 136 and 132 are received by the light detection systems 120A and 120B through the beam splitters 108A and 108B. In operation S740, the received two or more reflected beams of light are detected to generate two or more detected signals 128. As shown in FIG. 1, the reflected beams of light 136 and 132 are detected respectively by the light detection systems 120A and 120B. In operation S750, the two or more detected signals 128 are analyzed to determine if a defect exists at the two or more first locations. As shown in FIG. 1, the two or more detected signals 128 from the two or more first locations are sent to the control system 145 and the analyzer module 206 of the control system 145 determines if a defect exists at the two or more first locations.

Figure 8A:
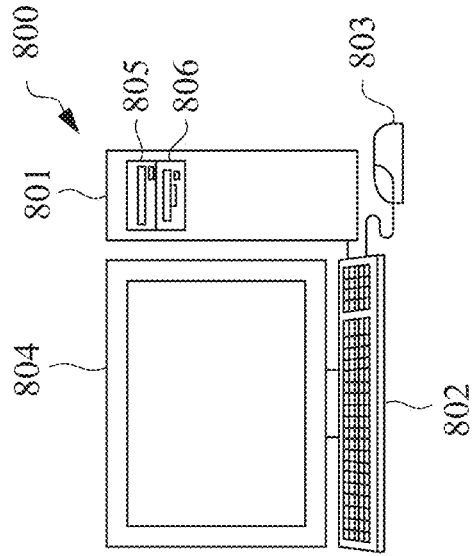
FIGS. 8A and 8B illustrate an apparatus for inspection of a semiconductor substrate in accordance with some embodiments of the disclosure.
Figure 8B:
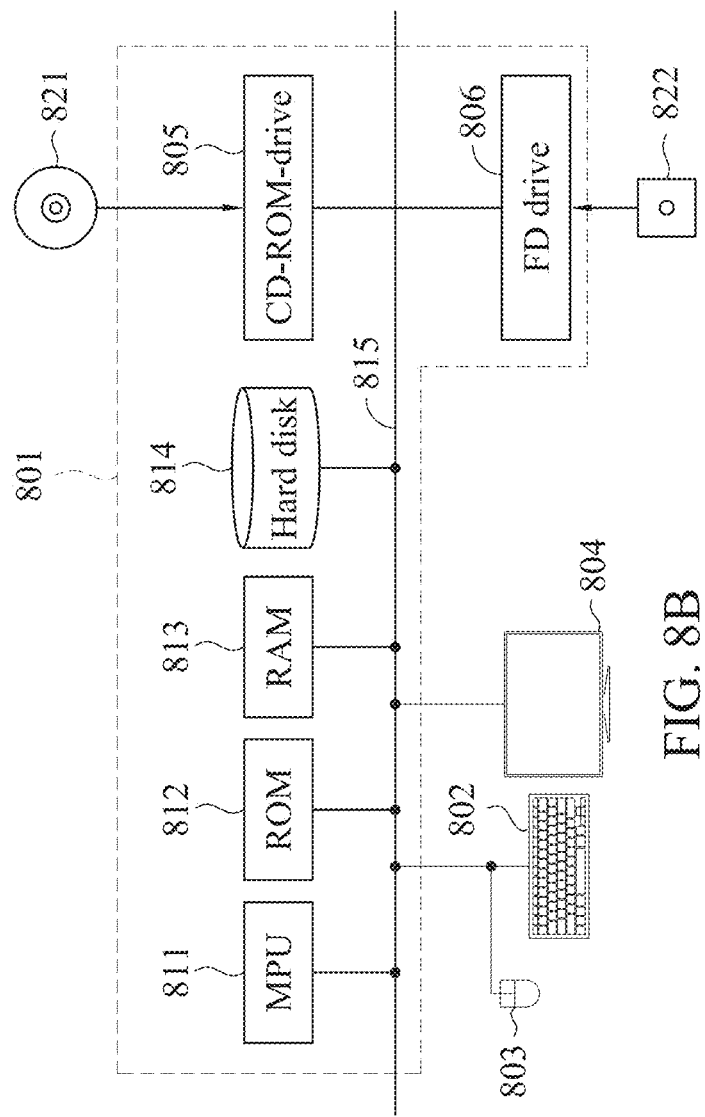

FIGS. 8A and 8B illustrate an apparatus for inspection of a semiconductor substrate in accordance with some embodiments of the disclosure. FIG. 8A is a schematic view of a computer system 800 that executes the process of the control system 145 of the inspection system 100. Thus, the computer system 800 executes the main controller 210 and the analyzer module 206. In addition, the computer system 800 executes the illumination controller 245 and the stage controller 125 of the inspection system 100. All of or a part of the processes, method and/or operations of the foregoing embodiments can be realized using computer hardware and computer programs executed thereon. The operations include receiving detected signals 128 or images generated from reflected light beams from one or more positions on a substrate, analyzing the detected signals 128 or images and determining if a defect exists at the two or more positions. In FIG. 8A, a computer system 800 is provided with a computer 801 including an optical disk read only memory (e.g., CD-ROM or DVD-ROM) drive 805 and a magnetic disk drive 806, a keyboard 802, a mouse 803, and a monitor 804.

FIG. 8B is a diagram showing an internal configuration of the computer system 800. In FIG. 8B, the computer 801 is provided with, in addition to the optical disk drive 805 and the magnetic disk drive 806, one or more processors 811, such as a micro-processor unit (MPU), a ROM 812 in which a program such as a boot up program is stored, a random access memory (RAM) 813 that is connected to the processors 811 and in which a command of an application program is temporarily stored and a temporary storage area is provided, a hard disk 814 in which an application program, a system program, and data are stored, and a bus 815 that connects the processors 811, the ROM 812, and the like. Note that the computer 801 may include a network card (not shown) for providing a connection to a LAN. In some embodiments, the computer system 800 includes the memory module 208.

The program for causing the computer system 800 to execute the process for inspecting the semiconductor substrate in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network. The program does not necessarily have to include, for example, an operating system (OS) or a third party program to cause the computer 801 to execute the process for manufacturing the lithographic mask of a semiconductor device in the foregoing embodiments. The program may only include a command portion to call an appropriate function (module) in a controlled mode and obtain desired results.

In some embodiments, implementing the processes and methods mentioned above, increases the throughput of scanning a substrate, e.g., a wafer, by simultaneously scanning multiple positions at a time on the substrate.

It will be understood that not all advantages have been necessarily discussed herein, no particular advantage is required for all embodiments or examples, and other embodiments or examples may offer different advantages.

According to some embodiments of the present disclosure, a method of manufacturing a semiconductor device includes splitting a first beam of light into two or more second beams of light and transmitting the two or more second beams of light onto a first set of two or more first locations on top of the semiconductor substrate, respectively. The method also includes in response to the transmitted two or more second beams of light, receiving two or more reflected beams of light from the first set of two or more first locations. The method further includes detecting the received two or more reflected beams of light to generate two or more detected signals. The method includes analyzing the two or more detected signals and determining, based on the analysis, whether a defect exists at the set of the two or more first locations. In an embodiment, the semiconductor substrate is mounted on a stage and the method further includes moving the stage to cause the two or more second beams of light to impinge onto a second set of two or more second locations on top of the semiconductor substrate and perform the receiving, the detecting, and the analyzing to determine, if a defect exists at the second set of two or more second locations. In an embodiment, the method further includes each one of the two or more second beams of light impinges onto a different location of the first set of two or more first locations. The first set of two or more first locations are arranged on a straight line, and a distance between each two consecutive first locations on the straight line is between 0.1 microns and 1000 microns. In an embodiment, the two or more second beams of light simultaneously impinge onto the first set of two or more first locations. In an embodiment, the semiconductor substrate is mounted on a stage and the method further includes moving the stage to cause the two or more second beams of light follow a spiral pattern around a center of the semiconductor substrate. In an embodiment, the method further includes directing the two or more second beams of light through an optical system to illuminate the first set of two or more first locations, and directing the two or more reflected beams of light through an imaging optics to project images of the first set of two or more first locations onto an illumination detector to generate the two or more detected signals. The two or more detected signals are two or more images of the first set of two or more first locations, and the two or more images analyzed to determine if the defect exists at the set of the two or more first locations. In an embodiment, the imaging optics includes one or more optical filters to perform one or more spatial filtering operations on the two or more images. The spatial operations includes sharpening, edge detection, or directional filtering.

According to some embodiments of the present disclosure, a method of manufacturing a semiconductor device includes transmitting a first beam of light from a first illumination source and transmitting a second beam of light from a second illumination source. The method also includes generating two or more third beams of light from the first beam of light and the second beam of light. The generating the two or more third beams of light includes splitting one of the first beam of light, splitting the second beam of light, or splitting both. The method includes impinging the two or more third beams of light onto a set of two or more first locations on top of the semiconductor substrate and in response to the impinged two or more third beams of light, receiving two or more reflected beams of light from the set of two or more first locations. The method further includes detecting the received two or more reflected beams of light, generating two or more detected signals based on the two or more reflected beams of light, analyzing the two or more detected signals, and determining, based on the analysis, if a defect exists at the set of two or more first locations. In an embodiment, the first beam of light is split into two or four beams of light. The second beam of light is split into two or four beams of light, and the two or more third beams of light includes four parallel beams of light, six parallel beams of light, or eight parallel beams of light. In an embodiment, the first and second beams of light is laser beams and the two or more third beams of light are parallel laser beams. In an embodiment, the two or more third beams of light impinge simultaneously on the set of two or more first locations, the set of two or more first locations are arranged along a straight line, and a distance between each two consecutive first locations on the straight line is a pitch of dies of the semiconductor substrate. In an embodiment, the method further includes directing the two or more third beams of light through an optical system to focus on the set of two or more first locations, and directing the two or more reflected beams of light through an imaging optics to focus the two or more reflected beams of light on an illumination detector to generate the two or more detected signals. The two or more detected signals are thicknesses of a designated layer on the semiconductor substrate at the set of two or more first locations, and the thicknesses are compared with a threshold level to determine if the defect exists at the set of the two or more first locations. In an embodiment, the semiconductor substrate is mounted on a stage, and the method further includes moving the stage to cause the two or more third beams of light follow a circular pattern around a center of the semiconductor substrate, and each one of the two or more third beams of light follows a separate circular pattern. In an embodiment, the semiconductor substrate is mounted on a stage and a reference chip is mounted on the stage, and the method further includes focusing the two or more third beams of light on the reference chip, receiving the two or more reflected beams of light from the reference chip, detecting the received two or more reflected beams of light by a corresponding illumination detector to generate the two or more detected signals, and calibrating illumination detectors based on the detected signals.

According to some embodiments of the present disclosure, an inspection system for semiconductor substrates includes a control system that includes a main controller and an analyzer module and an illumination system that includes one or more illumination sources. The system also includes a beam splitter system optically coupled to the illumination system that receives a first beam of light from a first illumination source of the illumination system. The beam splitter system splits the first beam of light and generates two or more second beams of light. The beam splitter system transmits the two or more second beams of light to impinge onto two or more first locations on top of a semiconductor substrate. The system further includes two or more beam splitters and two or more light detection systems. Each one of the two or more beam splitters is optically coupled to a separate light detection system. Each one of the two or more light detection systems receives, through a corresponding beam splitter, a separate reflected beam of light from one of the two or more first locations. Each one of the two or more light detection systems generates a detected signal based on the received reflected beam of light. The two or more light detection systems are coupled to the control system and the analyzer module of the control system receives the two or more detected signals. The analyzer module determines if a defect exists at the two or more first locations based on the two or more detected signals. In an embodiment, the illumination system further includes an illumination controller coupled to the one or more illumination sources to control the one or more illumination sources, and the system further includes an optical amplifier coupled between the one or more illumination sources of the illumination system and the beam splitter system to amplify an amplitude of a light beam of each one of the one or more illumination sources before being delivered to the beam splitter system. In an embodiment, the inspection system further includes a stage and the semiconductor substrate is mounted on the stage, and a stage controller coupled to the stage that controls the stage. The stage controller is coupled to the main controller and the main controller commands the stage controller to move the stage such that the two or more second beams of light impinge onto two or more second locations on the surface of the semiconductor substrate. In an embodiment, the inspection system further includes a reference chip mounted on the stage. The main controller commands the stage controller to move the stage such that the two or more second beams of light impinge on two or more positions on the reference chip. The control system receives two or more detected signals based on two or more reflected beams of light from the two or more positions on the reference chip, and the analyzer module of the control system calibrates the two or more light detection systems based on the two or more detected signals. In an embodiment, each one of the light detection systems includes an illumination detector, and an imaging optics that includes on one or more optical filters. The imaging optics filters a reflected beam of light from each one of the two or more first locations. The imaging optics projects the reflected beam of light on the illumination detector. In an embodiment, the first illumination source is a narrow-band illumination source, and an optical system is mounted between the two or more beam splitters and the substrate to inspection system to either illuminate, using the optical system, the two or more first locations by the two or more second beams of light to acquire two or more images of the two or more first locations. The two or more detected signals are two or more detected images of the two or more first locations, and the analyzer module determines if a defect exists in the two or more detected images. Or, focus, using the optical system, the two or more second beams of light on the two or more first locations to perform a thickness measurement of a top layer of the semiconductor substrate at the two or more first locations. The two or more detected signals are two or more detected thicknesses of the top layer at the two or more first locations, and the analyzer module determines if a defect exists at the two or more first locations by comparing the two or more detected thicknesses with a thickness threshold.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    transmitting two or more incident beams of light onto a first set of two or more first locations on top of a semiconductor substrate, respectively;
    in response to the two or more incident beams of light, receiving two or more reflected beams of light from the first set of two or more first locations;
    detecting, by two or more illumination detectors, the two or more reflected beams of light to generate two or more detected signals;
    analyzing the two or more detected signals; and
    determining, based on the analysis, whether a defect exists at the first set of the two or more first locations,
    wherein the semiconductor substrate and a reference chip are mounted on a stage, wherein the two or more incident beams of light are focused on the reference chip, and wherein two or more second reflected beams of light are received from the reference chip respectively by the two or more illumination detectors for calibration thereof.

2. The method of claim 1, wherein a beam of light from an illumination source is split into the two or more incident beams of light.

3. The method of claim 1, wherein the two or more incident beams of light are respectively from two or more illumination sources.

4. The method of claim 1, wherein the received second reflected beams of light from the reference chip are respectively detected by the two or more illumination detectors to generate two or more second detected signals, and wherein the two or more illumination detectors are calibrated based on the received second detected signals.

5. The method of claim 1, further comprising:
    moving the stage to cause the two or more incident beams of light to impinge onto a second set of two or more second locations on top of the semiconductor substrate; and
    perform the receiving, the detecting, and the analyzing to determine if a defect exists at the second set of two or more second locations.

6. The method of claim 1, wherein each one of the two or more incident beams of light impinges onto a different location of the first set of two or more first locations, wherein the first set of two or more first locations are arranged on a straight line.

7. The method of claim 1, further comprising moving the stage to cause the two or more incident beams of light to follow a spiral pattern around a center of the semiconductor substrate.

8. The method of claim 1, further comprising:
    directing the two or more incident beams of light through an optical system to illuminate the first set of two or more first locations; and
    directing the two or more reflected beams of light through an imaging optics to project images of the first set of two or more first locations onto an illumination detector to generate the two or more detected signals, wherein the two or more detected signals are two or more images of the first set of two or more first locations, and wherein the two or more images are analyzed to determine if the defect exists at the first set of the two or more first locations.

9. The method of claim 8, wherein the imaging optics comprises one or more optical filters to perform one or more spatial filtering operations on the two or more reflected beams of light.

10. A method of manufacturing a semiconductor device, comprising:
    generating two or more third beams of light from at least one of a first beam of light from a first illumination source and a second beam of light from a second illumination source;

impinging the two or more third beams of light onto a set of two or more first locations on top of a semiconductor substrate;

in response to the impinged two or more third beams of light, receiving two or more reflected beams of light from the set of two or more first locations; and determining, based on the received two or more reflected beams, if a defect exists at the set of two or more first locations, wherein the first beam of light is split into two or four beams of light, wherein the second beam of light is split into two or four beams of light, and wherein the two or more third beams of light comprises four parallel beams of light, six parallel beams of light, or eight parallel beams of light.

11. The method of claim 10, wherein the generating the two or more third beams of light comprises splitting one of the first beam of light and the second beam of light, or splitting both.

12. The method of claim 10, wherein the determining if the defect exists at the set of two or more first locations comprises:

detecting the received two or more reflected beams of light;

generating two or more detected signals based on the two or more reflected beams of light; and analyzing the two or more detected signals to determine if the defect exists at the set of two or more first locations.

13. The method of claim 12, wherein the semiconductor substrate and a reference chip are mounted on a stage, the method further comprising:

focusing the two or more third beams of light on the reference chip;

receiving the two or more reflected beams of light from the reference chip;

detecting the received two or more reflected beams of light by a corresponding illumination detector to generate the two or more detected signals; and calibrating illumination detectors based on the detected signals.

14. The method of claim 10, wherein the two or more third beams of light impinge simultaneously on the set of two or more first locations, wherein the set of two or more first locations are arranged along a straight line, and wherein a distance between each two consecutive first locations on the straight line is a pitch of dies of the semiconductor substrate.

15. The method of claim 10, wherein the first and second beams of light are laser beams, and the two or more third beams of light are parallel laser beams.

16. The method of claim 10, wherein the semiconductor substrate is mounted on a stage, the method further comprising:

moving the stage to cause the two or more third beams of light follow a circular pattern around a center of the semiconductor substrate, wherein each one of the two or more third beams of light follows a separate circular pattern.

17. An inspection system for semiconductor substrates, comprising:

a beam splitter system configured to split a first beam of light from a first illumination source of one or more illumination sources, to generate two or more second beams of light and to impinge onto two or more first locations on top of a semiconductor substrate; and two or more beam splitters and two or more light detection systems, wherein the two or more beam splitters are positioned such that the two or more second beams of light respectively pass through the two or more beam splitters before impinging onto the two or more first locations, each one of the two or more beam splitters is optically coupled to one of the two or more light detection systems, wherein each one of the two or more light detection systems is configured to receive, through a corresponding beam splitter of the two or more beam splitters, a reflected beam of light from one of the two or more first locations, wherein each one of the two or more light detection systems are configured to generate a detected signal based on the received reflected beam of light, wherein the two or more light detection systems are coupled to an analyzer module configured to receive two or more detected signals, and wherein the analyzer module is configured to determine if a defect exists at the two or more first locations based on the two or more detected signals.

18. The inspection system of claim 17, wherein the first illumination source is a narrow-band illumination source, and wherein an optical system is mounted between the two or more beam splitters and the substrate to illuminate, using the optical system, the two or more first locations by the two or more second beams of light to acquire two or more images of the two or more first locations, wherein the two or more detected signals are the two or more images of the two or more first locations, and wherein the analyzer module is configured to determine if a defect exists in the two or more images.

19. The inspection system of claim 17, further comprising:

an optical amplifier coupled between the one or more illumination sources of the inspection system and the beam splitter system, wherein the optical amplifier is configured to amplify an amplitude of a light beam of each one of the one or more illumination sources before being delivered to the beam splitter system.

20. The inspection system of claim 17, further comprising:

a stage, wherein the semiconductor substrate is mounted on the stage; and a stage controller configured to control and to move the stage such that the two or more second beams of light impinge onto two or more second locations on a surface of the semiconductor substrate.

* * * * *